United States Patent [19]

Natesan

[11] Patent Number: 5,164,270
[45] Date of Patent: *Nov. 17, 1992

[54] IRON-BASED ALLOYS WITH CORROSION RESISTANCE TO OXYGEN-SULFUR MIXED GASES

[75] Inventor: Krishnamurti Natesan, Naperville, Ill.

[73] Assignee: The United States of America as represented by the Department of Energy, Washington, D.C.

[*] Notice: The portion of the term of this patent subsequent to Sep. 11, 2001 has been disclaimed.

[21] Appl. No.: 486,665

[22] Filed: Mar. 1, 1990

[51] Int. Cl.⁵ .................. B32B 15/00; C22C 38/48
[52] U.S. Cl. .................... 428/660; 420/54; 420/584.1; 428/610; 428/661; 428/662; 428/941
[58] Field of Search .......... 420/54, 583, 584.1; 428/610, 941, 660, 661, 662, 941

[56] References Cited

U.S. PATENT DOCUMENTS 2,990,293  6/1961  Toulmin, Jr. ............... 428/660
4,470,848  9/1984  Natesan et al. ............. 420/54

FOREIGN PATENT DOCUMENTS 4525434  8/1970  Japan ...................... 428/941

OTHER PUBLICATIONS

Conference Abstract entitled "Role of Alloying Additions in the Early Stage of Oxidation of Fe-Based Alloys", by K. Natesan and J. H. Park, Abstracts for the 118th Annual Meeting of TMS/AIME held Feb. 27–Mar. 2, 1989.

"Role of Alloying Additions in the Oxidation–Sulfidation of Fe–Base Alloys", K. Natesan and J. H. Park, *Corrosion and Particle Erosion at High Temperatures*, edited by V. Srinivasan and K. Vedula; The Minerals, Metals & Materials Society, 1989, [Proceedings of a Symposium at Las Vegas, Nev., Feb. 27–Mar. 3, 1989].

*Primary Examiner*—R. Dean
*Assistant Examiner*—Robert R. Koehler
*Attorney, Agent, or Firm*—William Lohff; James W. Weinberger; William R. Moser

[57] ABSTRACT

An iron-based alloy with improved performance with exposure to oxygen-sulfur mixed gases with the alloy containing about 9-30 wt. % Cr and a small amount of Nb and/or Zr implanted on the surface of the alloy to diffuse a depth into the surface portion, with the alloy exhibiting corrosion resistance to the corrosive gases without bulk addition of Nb and/or Zr and without heat treatment at temperatures of 1000°–1100° C.

4 Claims, 6 Drawing Sheets

IRON-BASED ALLOYS WITH CORROSION RESISTANCE TO OXYGEN-SULFUR MIXED GASES

CONTRACTUAL ORIGIN OF THE INVENTION

The United States Government has rights in this invention pursuant to Contract No. W-31-109-ENG-38 between the U.S. Department of Energy and The University of Chicago representing Argonne National Laboratory.

BACKGROUND OF THE INVENTION

This invention relates to corrosion resistance in iron-based alloys exposed to gases containing oxygen and/or sulfur and particularly to Fe-Cr and Fe-Cr-Ni alloys exposed to oxygen-sulfur mixed-gas environments.

Iron-based alloys and particularly those alloys with Cr and Cr-Ni may be identified as structural alloys for use in the fabrication of coal gasifiers, coal combustion units, and other equipment designed to operate at temperatures in the order of 500-1000° C. Upon exposure to aggressive gaseous environments at elevated temperatures, these alloys become dependent on their ability to form and maintain protective surface oxide scales of $Cr_2O_3$. However, in oxygen-sulfur mixed-gas environments, typical of those encountered in coal gasification and combustion atmospheres, it has been recognized that a thermodynamically stable protective oxide may not form owing to the presence of sulfur in the gas phase. In addition, the presence of sulfur also may significantly increase the corrosion rate on these alloys over that in air or other oxygen atmosphere.

In U.S. Pat. No. 4,470,848 issued Sep. 11, 1984 for Natesan and Baxter and assigned to the U.S. Government, the invention involved the improved high-temperature performance of iron-based alloys to oxidative and/or sulfidative conditions by the addition of about 1-8 wt.% of Nb or Zr to the bulk alloy.

In general, it was believed that the additive would form intermetallics with iron and any nickel with the chromium concentration thereby increasing in the alloy matrix to form $Cr_2O_3$ as a protective scale on the surface. In providing the desired protection, it was particularly useful to anneal the alloy after addition of Nb or Zr at a temperature of 1100° C. for up to 7 h. One purpose of this treatment was to aid in the migration of Nb or Zr to the surface portion of the structure to promote the formation of $Cr_2O_3$. Subsequently, it was also found that for Nb, a layer of oxidized Nb was also formed at the exposure temperature below the protective $Cr_2O_3$ with the internal oxide layer acting as a barrier to migration outwards of iron from the substrate alloy.

While the invention in U.S. Pat. No. 4,470,848 provided improved high-temperature resistance of iron-based alloys to attack by corrosive gases containing oxygen and sulfur, new protective techniques were of interest to avoid the limitations resulting from the high temperature annealing at 1000-1100° C. and the requirement for the addition of the Nb or Zr to the bulk alloy. In particular, it is important to provide protection to these iron-based alloys which are exposed to lower temperatures of 100-700° C. during heat treatment or under process conditions. Under these circumstances, the concentration of Nb or Zr required in the bulk alloy may be considerable in order to provide the desired concentration at the surface region of the alloy to resist attack by oxygen-sulfur mixed gas environments.

Accordingly, one object of this invention is an iron-based alloy with protection against attack by corrosive gases containing oxygen and sulfur. Another object of this invention is an Fe-Cr or Fe-Cr-Ni alloy with resistance to those corrosive gases in which the processing of the alloy does not require annealing at 1000-1100° C. Still another object of the invention is an Fe-Cr or Fe-Cr-Ni alloy with the desired corrosion resistance without the addition of Nb or Zr to the bulk alloy. These and other objects of the invention will become apparent from the following description.

SUMMARY OF THE INVENTION

Briefly, the invention is directed to iron-based alloys whose resistance to attack by corrosive gases is improved by surface modification via implantation of Nb or Zr to the surface portion of the alloy. The resulting alloy composition preferably contains chromium with optional levels of nickel and a small content of Nb or Zr principally within the surface portion of the alloy and primarily below the scale at the surface. Protection is achieved without high temperature annealing at 1000-1100° C. The surface modification may be carried out by techniques to diffuse the additive into the surface portion and preferably is carried out by ion implantation.

Several advantages result from the invention. The surface modification for the desired resistance may be carried out at lower temperatures and avoids the high temperature heat treatment of the alloy. A protective $Cr_2O_3$ scale is formed early in the exposure process with the oxide grain size being significantly larger than the size for the base alloy. It is believed that the addition of Nb or Zr effectively increases the thermodynamic activity and diffusivity of chromium in the surface region of the alloy. Except where a high sulfur concentration (and sulfur oxide) is present, the protective scale is $Cr_2O_3$ with essentially no iron or transient oxides of iron in the scale. Resistance to gases containing sulfur appear to be improved. At low sulfur environments, the alloys with the surface modification of the invention undergo the oxidation mode of interaction to form $Cr_2O_3$ while the alloys without such modification sulfidize at higher rates. In high sulfur environments, the alloys with the surface modification may form a slow-growing scale of chromium sulfide while the alloys without such modification may develop massive growths of sulfides of Fe, Cr or Fe, Ni. Resistance to attack by oxygen-sulfur mixed-gas environments also appear to be attainable at temperatures of 400-700° C.

DETAILED DESCRIPTION OF THE PREFERRED EMBODIMENT

In this invention, iron-based alloys of particular interest are those containing chromium to provide the desired protection and include those containing chromium in the range of 9-30 wt.%. Nickel may also be present in about 10-25 wt.% and iron is the predominant remaining component other than the added component of Nb, Zr, or mixtures of Nb and Zr. The amount of Nb or Zr added to the base alloy usually is small but sufficient to impart improved resistance to the alloy with amounts in the order of about 3-10 wt.% being preferred.

The effect of adding Nb, Zr or their mixtures to the base alloy is a modification of the surface portion to incorporate the added component. Advantageously, the addition is carried out to diffuse particles of the component as a vapor into the alloy to a depth below the surface. The addition is carried out by an implantation technique where particles of the component are forced into the surface of the alloy. Preferably, the implantation is by ion implantation.

The method of implanting Nb or Zr in the surface portion of the iron-based alloy is carried out to cause an implantation of the additive on the alloy surface and preferably a diffusion to a small depth below the surface. In general, the depth may extend to about 800-1000 Å. While the degree of combination of the additive with the components of the base alloy is not completely known, the results in the following description show the improved performance of the alloy.

In the ion-implantation process, energetic ions of Nb and/or Zr are accelerated and made to strike the alloy surfaces used as target within a vacuum chamber. As an illustration, Nb ions with energies of about 182 keV are used which penetrate the iron-based alloy surfaces to a depth of a few hundred Angstroms. The implanted ions and the host atoms in the target rearrange in the near-surface region of the samples to alter the properties of the alloy, and particularly the development of protective oxide scales and their sulfur resistance.

The protection provided by the implantation of Nb or Zr in the iron-based alloys is particularly important when the alloys are to be exposed to sulfur-containing gases. In the absence of Nb or Zr additions, Fe-based alloys containing Cr and/or Ni exhibit corrosion rates that are significantly higher when exposed to low- or high-sulfur environments. In some instances, sufficient oxygen is not present to form $Cr_2O_3$ scale and either a mixed oxide/sulfide or a sulfide scale forms. Under these conditions, the protective effect of the Nb or Zr additions is to either stabilize the $Cr_2O_3$ scale in the early stage of exposure or to reduce the amount of scale to a small fraction of that forming in the base alloy without Nb or Zr additions.

The following examples are provided for illustrative purposes and are not intended to be restrictive as to the scope of the invention.

EXAMPLES I-II

Base alloys of Fe-25 wt.% Cr and Fe-25 wt.% Cr-20 wt.% Ni, obtained from Carpenter Technology Corporation of Reading, Pa., were used in the ion implantation studies. The alloys were prepared by vacuum induction melting followed by electroslag refining to minimize undesirable contaminants. After melting, the alloys were cast into ~82-mm-diam round ingots. The alloy compositions are given in Table I. After refining, the alloys were cast into ~147-mm-diam round ingots. These ingots were soaked for two hours at ~1176° C. for the Fe-Cr-Ni alloy and at 1065° C. for the Fe-Cr alloy, and forged into rods of ~57-mm square cross section. The forged alloys were cut and reheated to the soaking temperature for 0.5 h, hot rolled into rods (~25-mm square cross section), and slowly cooled to room temperature. The rods were subsequently hot rolled into sheets and were given a final anneal at 1050° C. for ~1 h. Specimens 11×11×0.7 mm in size were prepared and given a final 1-μm diamond polish. These samples were tested as described in Examples I-VIII.

TABLE I

| Chemical Compositions for Base Alloys Used for Nb Implantation | | | | | | | | | |
|---|---|---|---|---|---|---|---|---|---|
| | C | Mn | Si | P | S | Cr | Ni | Al | Fe |
| Fe—25Cr | 0.001 | <0.01 | <0.01 | <0.005 | 0.003 | 25.04 | <0.01 | <0.01 | Balance |
| Fe—25Cr—20Ni | 0.004 | <0.01 | <0.001 | <0.005 | 0.02 | 24.84 | 19.91 | 0.01 | Balance |

Figure 1:
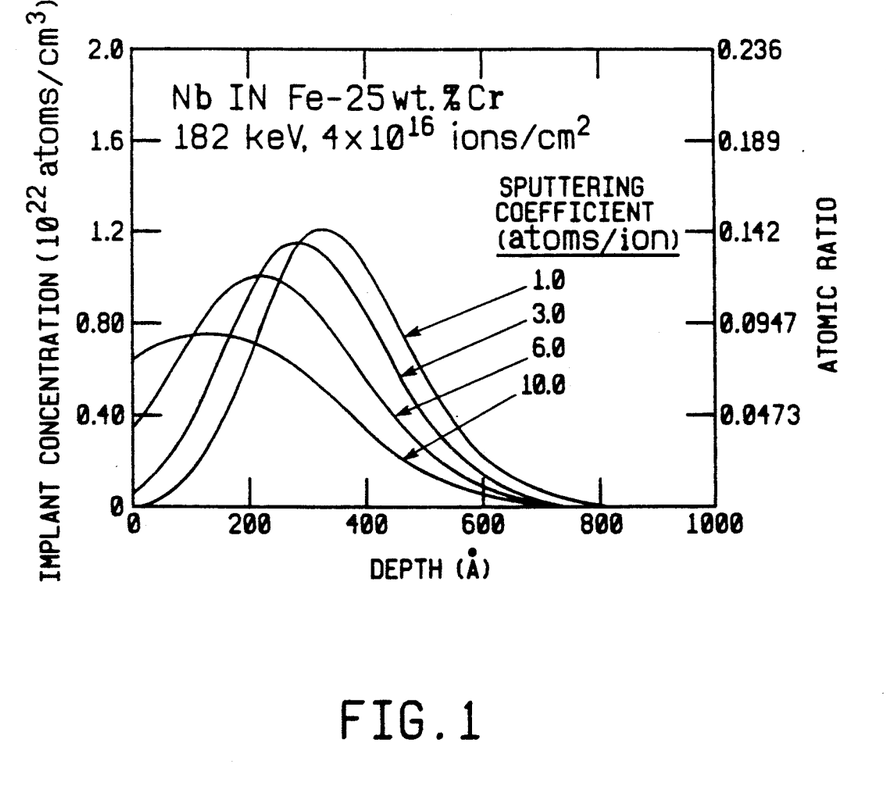
FIG. 1 is a graph of the calculated depth profiles for implantation in Fe-Cr alloys to illustrate certain aspects of the invention.

The finely polished specimens of both base alloys were implanted with niobium at an implant energy of 182 keV and a dose level of $4 \times 10^{16}$ ions/cm². The implantation was performed at Implant Sciences of Danvers, MA. Implant depth profiles were calculated on the basis of several different assumed values of the sputtering coefficient, and the calculated profiles are shown in FIG. 1. Auger electron spectroscopy (AES) was used to determine the depth profiles in the implanted specimens as well as those exposed in various gaseous environments.

Thermogravimetric analysis (TGA) tests were conducted with an electrobalance, made by CAHN Instruments, Inc. of California, that had a sample capacity of 2.5 g with a sensitivity of 0.1 μg. The furnace consisted of three-zone Kanthal heating elements with a temperature capability of 1100° C. in continuous operation. The test specimens were suspended from the balance with an ~200-μm-diam platinum wire. The tests were started at room temperature by purging the system with the appropriate reaction gas mixture. The specimen was heated in the reaction gas to the desired test temperature. The heating time was normally less than 1200 s. Four different reaction gas mixtures were used in the experiments, namely, high-purity air, a 1 vol.% CO—$CO_2$ gas (low-$p_{O_2}$ environment), and two other reaction gases containing CO, $CO_2$, $H_2$, and $H_2S$. The relative flow rates of the different gases were adjusted to achieve two different sulfur levels in the reaction gas. Table II lists the calculated oxygen and sulfur partial pressures established by different reaction gas mixtures. Upon completion of the test, the furnace was opened and the specimen was cooled rapidly in the reaction gas environment. The cooling time to reach ~100° C. was generally less than 600 s.

TABLE II

Calculated Partial Pressures (in atm) of Oxygen and Sulfur in Various Reaction Gas Mixtures at 700° C.

| Gas Mixture | $P_{O_2}$ | $P_{S_2}$ |
| --- | --- | --- |
| Air | 0.21 | — |
| 1 vol. % CO—CO$_2$ | $5.45 \times 10^{-18}$ | — |
| Low-$P_{S_2}$ Gas | $1.91 \times 10^{-21}$ | $3.1 \times 10^{-10}$ |
| High-$P_{S_2}$ Gas | $1.93 \times 10^{-21}$ | $2.5 \times 10^{-8}$ |

Figure 2A:
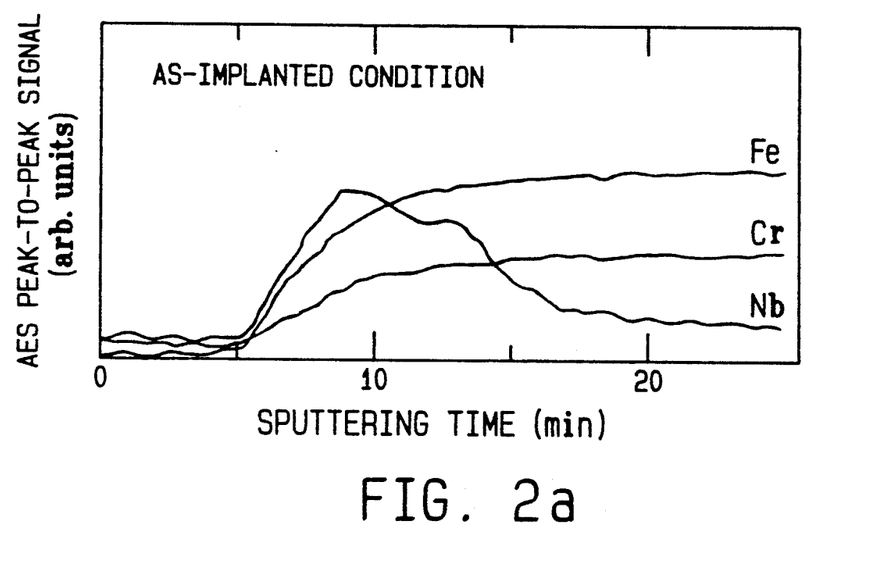
FIG. 2a is an AES depth profile analysis for Fe-25 wt.% Cr alloy in the Nb-implanted condition as an illustration of the invention.
Figure 2B:
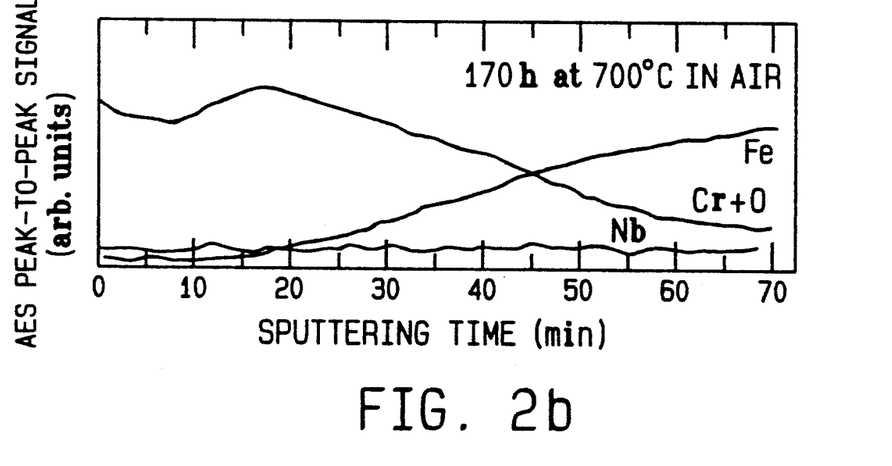
FIG. 2b is an AES depth profile analysis of the alloy of FIG. 2a after air oxidation for 170 h at 700° C.

After the thermogravimetric tests, the corrosion product scales were analyzed by means of several electron-optical techniques. A scanning electron microscope equipped with an energy dispersive x-ray analyzer was used to examine the exposed surfaces and cross sections. Auger electron spectroscopy (AES) was used to determine the depth profiles of several exposed specimens, especially those with implanted niobium. The sputtering rate was ~30 Å/min which indicates a peak in niobium concentration at a depth of ~300 Å. FIG. 2a shows the AES depth profile analysis for a Nb-implanted alloy. FIG. 2b shows the AES depth profile analysis for the alloy of FIG. 2a after oxidation for 170 h in air at 700° C.

SEM photographs of surfaces of Fe-25 wt.% Cr alloy in both with and without implant and after 170 h of exposure in air at 700° C. provided information to show that the scale to be predominantly Cr oxide. The physical size of the globular oxide particles in the implanted specimens was ~1 to 2 μm, significantly larger than the value of 0.1 to 0.3 μm observed in the absence of implantation. A similar increase in grain size of the oxide in alloys with refractory metal additions was reported in alloys in which Nb or Zr additions were made to the bulk alloy.

Figure 3:
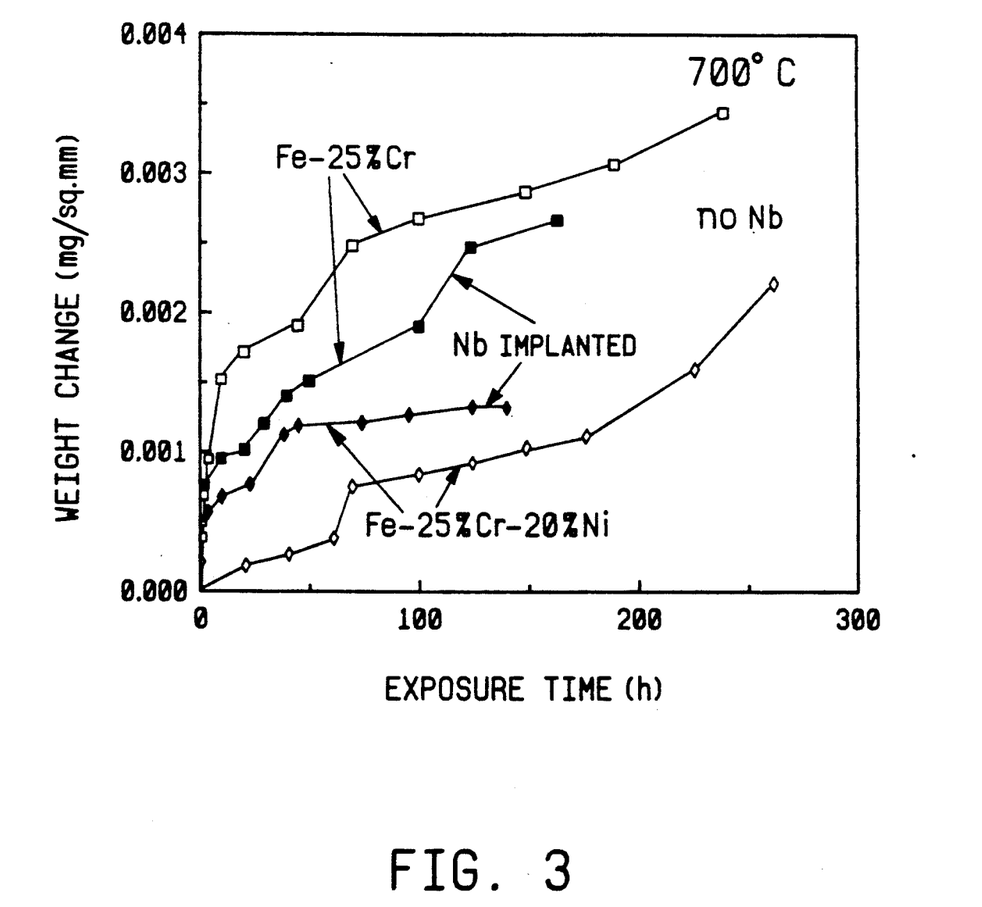
FIG. 3 is a graph showing the weight change data for Fe-25 wt.% Cr and Fe-25 wt.% Cr-20 wt.% Ni, alloys with and without implanted Nb after air exposure at 700° C. with the implanted samples being illustrative of the invention.

FIG. 3 shows the TGA data for Fe-25 wt% Cr and Fe-25 wt.% Cr-20 wt.% Ni alloys with and without implanted Nb in air at 700° C. The absolute values of weight changes are extremely small in all cases, and Nb implantation seems to have no deleterious effect on the oxidation rate even though oxidation of pure Nb generally leads to scale spallation and catastrophic oxidation. However, an analysis of surfaces of oxidized samples shows that the oxide grain size is larger for Nb-implanted samples than for the pure binary alloy. Even in the case of the ternary Fe-Cr-Ni alloy, the oxide grain size is somewhat larger even though the Nb-implanted specimen was exposed only half as long as the pure ternary alloy.

EXAMPLES III–IV

Figure 4:
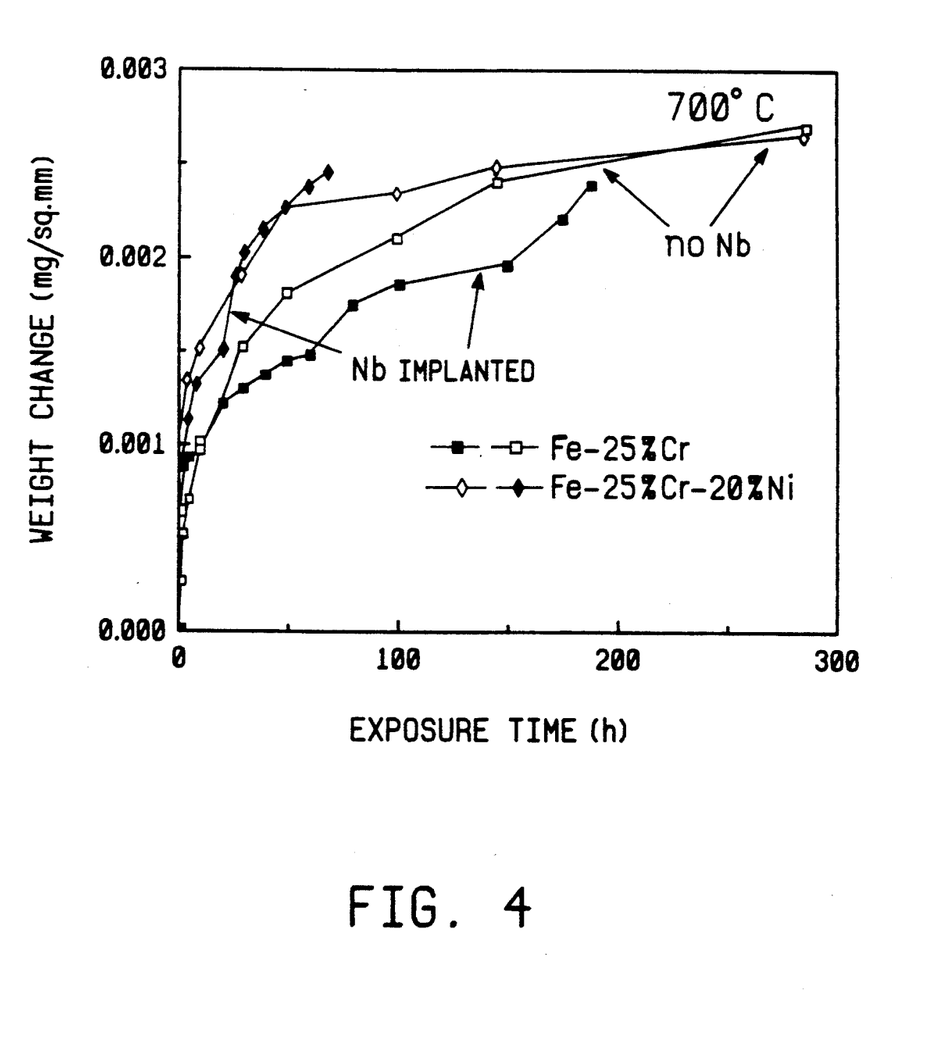
FIG. 4 is a graph showing the weight change data for Fe-25 wt.% Cr and Fe-25 wt.% Cr-20 wt.% Ni alloys with and without implanted Nb after exposure to a low-oxygen environment at 700° C. with the implanted samples being illustrative of the invention.

Since the oxygen-sulfur mixed-gas environments in coal gasification systems involve $p_{O_2}$ values that are orders of magnitude lower than that of air, the TGA experiments were conducted to examine the oxidation behavior of Nb-implanted specimens under low-$p_{O_2}$ conditions. The samples were prepared as described in Examples I-II. FIG. 4 shows the weight-change curves for specimens of Fe-25 wt.% Cr and Fe-25 wt.% Cr-20 wt.% Ni with and without implanted Nb exposed to the 1-vol.% CO-CO$_2$ gas mixture at 700° C. The weight changes are comparable to those observed in air-exposed specimens. As before, the implanted Nb had very little effect, if any, on the oxidation rate. The oxide scales were predominantly Cr oxide, with almost no iron in them. SEM photographs of surfaces of the two alloys with an without implanted Nb after exposure to low $p_{O_2}$ at 700° C. show the oxide scales in the Fe-Cr-Ni alloy to be extremely thin, as evidenced by the polishing lines; however, the oxide grain size in the Nb-implanted specimen is somewhat larger than that of unimplanted specimens even though the exposure time for the implanted alloy was only a third as long. On the other hand, the Fe-25 wt.% Cr alloy exhibited a much denser and finer-grained oxide in the implanted than in the unimplanted condition.

EXAMPLES V–VI

Figure 5:
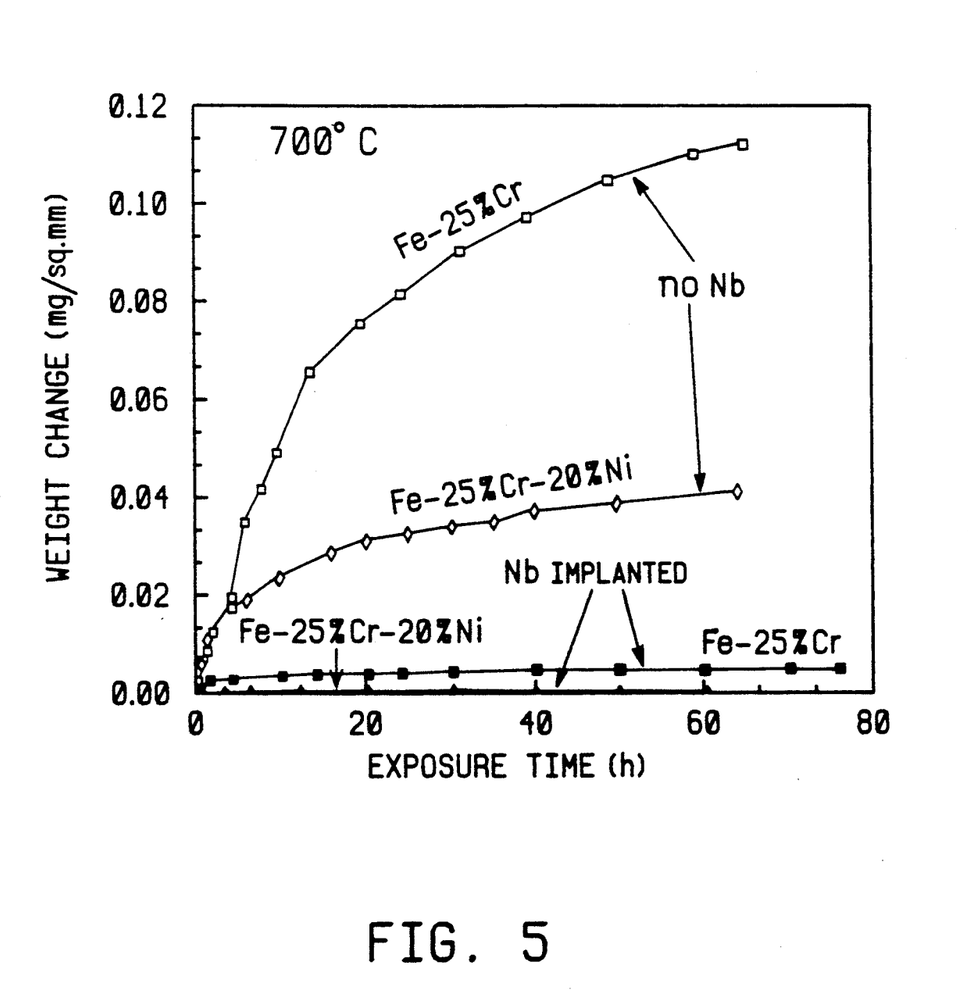
FIG. 5 is a graph showing weight change data for Fe-25 wt.% Cr and Fe-25 wt.% Cr-20 wt.% Ni alloys with and without implanted Nb after exposure to a low-sulfur mixed-gas environment with the implanted samples being illustrative of the invention.

Two different oxygen-sulfur gas mixtures (see Table II) were selected for the exposure of Nb-implanted specimens. These samples were also prepared as described in Examples I-II. FIG. 5 shows the TGA data for Fe-25 wt.% Cr and Fe-25 wt.% Cr-20 wt.% Ni alloys with and without implanted Nb after exposure to low-sulfur mixed-gas environments. The results clearly indicate a substantial reduction in the oxidation rate of the implanted alloys of both base compositions. The alloys without implanted Nb exhibited a sulfide mode of attack while those with implanted Nb showed an oxide mode of interaction. The oxide scale thicknesses in the implanted specimens were comparable to those observed in sulfur-free environments. The oxide scales were predominantly Cr oxide with very little iron, as was observed in studies conducted in sulfur-free atmospheres. SEM photographs of the cross sections of the oxidized alloys show the scale thicknesses of the unimplanted alloys to range from 20 to 25 μm, whereas those of the implanted alloys ranged from 1 to 2 μm.

EXAMPLES VII–VIII

Figure 6:
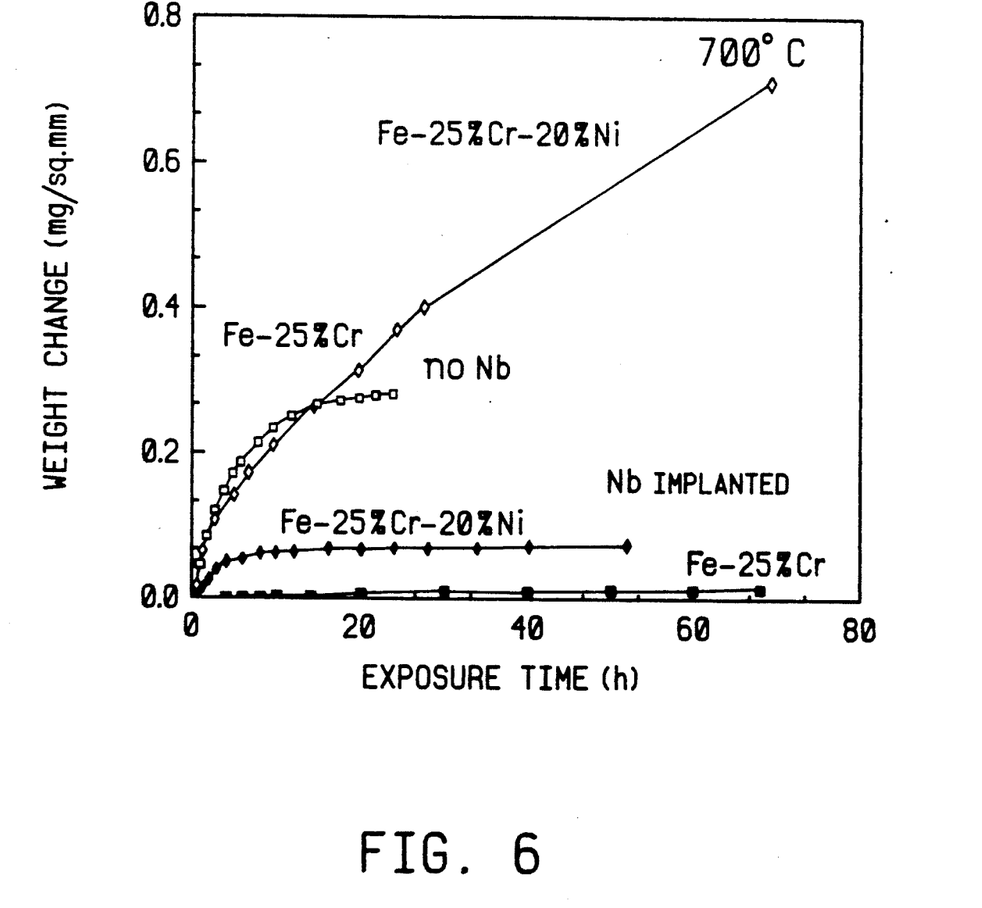
FIG. 6 is a graph showing weight change data for Fe-25 wt.% Cr and Fe-25 wt.% Cr-20 wt.% Ni alloys with and without implanted Nb after exposure to a high-sulfur mixed-gas environment at 700° C. with the implanted samples being illustrative of the invention.

FIG. 6 shows the TGA data for the two alloys with and without implanted Nb after exposure to high-sulfur mixed gas at 700° C. The samples were prepared as described in Examples I-II. Again, the corrosion rates are substantially lower for Nb-implanted specimens than for the unimplanted base alloys. The absolute rates for the implanted specimens exposed to the high-sulfur gas are somewhat higher than for those exposed in sulfur-free or low-sulfur mixed-gas environments. But neither of the implanted alloys undergoes breakaway corrosion within the exposure times of the present investigation. The beneficial effect of implanted Nb was much greater for the Fe-25 wt.% Cr than for the Fe-25 wt.% Cr-20 wt.% Ni alloy. From a study of the surface morphologies of the two alloys with and without implanted Nb, after exposure to a high-sulfur environment, it is evident that both unimplanted alloys and the Nb-implanted ternary alloy underwent a sulfide mode of attack. The Nb-implanted binary alloy exhibited an oxide mode of attack, with some particles of sulfide on the surface. Cross sections of the two alloys with and without implanted Nb after exposure to high-sulfur mixed gas were also studied. The specimens without implanted Nb exhibited scale thicknesses in the 200–600 μm range, whereas the implanted specimens showed 10–30 μm thick.

Extensive AES analysis of exposed specimens showed some differences in scale compositions depending on whether sulfur was present or absent in the exposure atmosphere. For example, the depth profile analysis of the implanted binary alloy that was exposed to low-sulfur mixed gas showed virtually no iron in the chromium oxide scale to a depth of 2 μm. This indicates that the Nb implantation process effectively increases the diffusivity and thermodynamic activity of Cr in the alloy in the implanted region. It is possible that the diffusivity alone can be increased as a result of the implant damage created by an inert implant, but such a process will lead to increases in diffusivities of iron as well as chromium. The scale composition results clearly indicate that Nb plays a role in stabilizing the $Cr_2O_3$ scale. Furthermore, no sulfur was present in the scale developed under low-sulfur conditions. The Nb-implanted binary alloy exposed to a high-sulfur environment developed a sulfide scale; however, the scale was predominantly chromium sulfide and iron was virtually absent over a depth of 8 μm in the AES depth profile analysis. The low growth rate of "CrS" coupled with the absence of FeS can extend the time for the onset of breakaway corrosion in the alloy.

In addition, the scales in the Fe-25 wt.% Cr and Fe-25 wt.% Cr-20 wt.% Ni alloys were somewhat different, even though both had the same level of implanted Nb. An AES depth profile analysis of the Nb-implanted ternary alloy exposed to air and low-oxygen gas showed predominantly $Cr_2O_3$ scales. The absence of iron, especially in the scale developed in air, indicates that implanted Nb stabilizes the chromia scale, since the scales on unimplanted specimens were predominantly (Fe, Cr) oxide. The implanted ternary alloy developed (Fe, Cr)- and (Fe, Ni)-sulfide scales during low- and high-sulfur exposures, respectively. However, the scale thicknesses in the Nb-implanted specimens were about 20 times smaller than in the unimplanted specimens.

The alloy of the invention may be fabricated into process instrumentation components, critical components such as valve seats, thermowells, etc. for use at temperatures in the range of 400–800° C. and fabricated with alloys with surfaces modified by Nb and/or Zr.

The surface modification described above can also be employed in other alloys such as AISI types 304, 316, 310, 309, 446 and alloys such as Alloy 800, RA 333, and RA 330 to achieve the corrosion resistance benefits.

The foregoing description of embodiments of the invention has been presented for purposes of illustration and description. It is not intended to be exhaustive or to limit the invention to the precise form disclosed. Other modifications and variations are possible in light of the above teaching.

The embodiments of the invention in which an exclusive property or privilege is claimed are defined as follows:

1. A composition of matter comprising a bulk portion of an alloy of Fe and Cr and a surface portion of said alloy of Fe and Cr containing an additional component consisting essentially of Nb, Zr or mixtures thereof, the surface portion containing essentially all of the component to a depth of about 0–1000 A in said composition with the component being present in the alloy primarily as discrete atoms in an amount of about 3–10 wt.% to impart resistance to attack by oxygen-sulfur mixed-gas environments.

2. The composition of claim 1 containing about 15–25 wt.% Ni.

3. The composition of claim 1 wherein the component is Nb.

4. The composition of claim 1 wherein the surface portion contains an outer scale of a chromium oxide and/or sulfide as a result of corrosion in oxygen-sulfur, mixed gas environments.

* * * * *